(12) United States Patent
Graham et al.

(10) Patent No.: US 12,085,862 B2
(45) Date of Patent: Sep. 10, 2024

(54) LASER SYSTEM FOR SOURCE MATERIAL CONDITIONING IN AN EUV LIGHT SOURCE

(71) Applicant: ASML Netherlands B.V., Veldhoven (NL)

(72) Inventors: Matthew Ryan Graham, San Diego, CA (US); Spencer Rich, San Diego, CA (US); Sean W. McGrogan, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 141 days.

(21) Appl. No.: 17/633,643

(22) PCT Filed: Aug. 14, 2020

(86) PCT No.: PCT/EP2020/072939
§ 371 (c)(1),
(2) Date: Feb. 8, 2022

(87) PCT Pub. No.: WO2021/028592
PCT Pub. Date: Feb. 18, 2021

(65) Prior Publication Data
US 2022/0317576 A1 Oct. 6, 2022

Related U.S. Application Data

(60) Provisional application No. 62/887,160, filed on Aug. 15, 2019.

(51) Int. Cl.
*G03F 7/20* (2006.01)
*G03F 7/00* (2006.01)
*H05G 2/00* (2006.01)

(52) U.S. Cl.
CPC ...... *G03F 7/70266* (2013.01); *G03F 7/70033* (2013.01); *H05G 2/008* (2013.01)

(58) Field of Classification Search
CPC .. G03F 7/70266; G03F 7/70033; H05G 2/008
See application file for complete search history.

(56) References Cited

U.S. PATENT DOCUMENTS 7,598,509 B2   10/2009  Ershov et al.
8,173,984 B2   5/2012   Moriya et al.
(Continued)

FOREIGN PATENT DOCUMENTS

TW   201838483 A   10/2018

OTHER PUBLICATIONS

Chiara Giovanardi, European International Searching Authority, International Search Report and Written Opinion, counterpart PCT Application No. PCT/EP2020/072939, mailed Oct. 21, 2020, 11 pages total.

(Continued)

*Primary Examiner* — Mesfin T Asfaw
(74) *Attorney, Agent, or Firm* — DiBerardino McGovern IP Group LLC

(57) ABSTRACT

Disclosed is an apparatus and a method in which off-droplet measurements instead of on-droplet measurements of prepulse energy are used for pulse energy control. Prepulse energy is measured during an off-droplet nonexposure period and controlled to a prepulse energy setpoint. The prepulse energy can then be controlled open-loop to the prepulse energy setpoint during on-droplet periods. This effectively decouples the EUV dose control loop from the prepulse energy control loop and avoids negative side effects of coupling such loops, for example, loss of the part of the dose adjustment range available to the dose controller.

20 Claims, 4 Drawing Sheets

(56) References Cited

U.S. PATENT DOCUMENTS

| | | |
|---|---|---|
| 8,242,472 B2 | 8/2012 | Moriya et al. |
| 8,872,122 B2 | 10/2014 | Schafgans et al. |
| 8,872,123 B2 | 10/2014 | Crouch et al. |
| 9,000,403 B2 | 4/2015 | Crouch et al. |
| 2010/0117009 A1 | 5/2010 | Moriya et al. |
| 2010/0171049 A1 | 7/2010 | Moriya et al. |
| 2014/0191132 A1 | 7/2014 | Schafgans et al. |
| 2014/0191133 A1 | 7/2014 | Crouch et al. |
| 2014/0233005 A1 | 8/2014 | Crouch et al. |
| 2014/0264087 A1 | 9/2014 | Rafac et al. |
| 2017/0181258 A1 | 6/2017 | Ershov |

OTHER PUBLICATIONS

"Laser System for Source Material Conditioning in an EUV Light Source", Research Disclosure, Kenneth Mason Publications, Hampshire, UK, GB, vol. 676, No. 55 (Jul. 11, 2020) p. 1617.

LASER SYSTEM FOR SOURCE MATERIAL CONDITIONING IN AN EUV LIGHT SOURCE

CROSS REFERENCE TO RELATED APPLICATIONS

This application claims priority to U.S. Application No. 62/887,160, filed Aug. 15, 2019 and titled LASER SYSTEM FOR SOURCE MATERIAL CONDITIONING IN AN EUV LIGHT SOURCE, which is incorporated herein in its entirety by reference.

FIELD

The present application relates to light sources which produce extreme ultraviolet light by excitation of a source material, in particular to systems using one or more laser pulses for the preparation and excitation of EUV source material.

BACKGROUND

Extreme ultraviolet ("EUV") light, for example, electromagnetic radiation having wavelengths of around 50 nm or less (also sometimes referred to as soft x-rays), and including light at a wavelength of about 13 nm, is used in photolithography processes to produce extremely small features on substrates, for example, silicon wafers.

Methods for generating EUV light include, but are not limited to, altering the physical state of the source material to a plasma state. The source material includes an element, for example, xenon, lithium, or tin, with an emission line in the EUV range. In one such method, often termed laser produced plasma ("LPP"), the required plasma is produced by irradiating a source material, for example, in the form of a droplet, stream, or cluster of source material, with an amplified light beam that can be referred to as a drive laser. For this process, the plasma is typically produced in a sealed vessel, for example, a vacuum chamber, and monitored using various types of metrology equipment.

$CO_2$ amplifiers and lasers, which output an amplified light beam at a wavelength of about 10600 nm, can present certain advantages as a drive laser for irradiating the source material in an LPP process. This may be especially true for certain source materials, for example, for materials containing tin. For example, one advantage is the ability to produce a relatively high conversion efficiency between the drive laser input power and the output EUV power.

In the EUV light source, EUV may be produced in a multiple-step process in which a droplet of source material en route to an irradiation site is first struck by one or more pulses that primarily condition the droplet in its original or in a modified form for subsequent phase conversion at the irradiation site. Conditioning in this context may include altering the shape of the droplet, e.g., flattening the droplet, or the redistribution of the droplet material, e.g., at least partially dispersing some of the droplet material as a mist. For example, one or more pulses may hit a droplet to modify the distribution of the source material and then a subsequent pulse may hit the modified droplet to transform it to an EUV-emitting plasma. In some systems these pulses are provided by the same laser and in other systems the pulses are provided by separate lasers. These conditioning pulses are sometimes referred to as "prepulses" because they are earlier in time than the pulse or pulses that transform the droplet.

In some EUV systems the energy of these one or more prepulses ("PP energy") exhibits a tendency to drift. There is also a tendency of the PP energy to jump after a gas refill of the laser used to generate the pulses. These slow and fast fluctuations can alter the droplet modification process and, ultimately, the EUV power. For example, ten to twenty percent drifts/jumps in PP energy can cause a one percent to four percent loss of EUV power.

There is a need for systems and methods that provide greater PP energy stability.

SUMMARY

The following presents a summary of one or more embodiments in order to provide a basic understanding of the embodiments. This summary is not an extensive overview of all contemplated embodiments and is not intended to identify key or critical elements of all embodiments nor set limits on the scope of any or all embodiments. Its sole purpose is to present some concepts of one or more embodiments in a simplified form as a prelude to the more detailed description that is presented later.

According to one aspect of an embodiment there is disclosed an apparatus and method in which off-droplet PP energy is measured and controlled to drive the off-droplet PP energy to an off-droplet PP energy setpoint. The PP energy thus attained is then used during on-droplet periods. This effectively decouples the EUV dose control loop from the PP energy control loop and avoids negative side effects of coupling such loops, for example, loss of part of the dose adjustment range available to the dose controller. In other words, the PP energy loop is active only for off-droplet shots, whereas the dose control loop is active only for on-droplet shots.

According to an aspect of an embodiment, there is disclosed an apparatus for generating extreme ultraviolet radiation using source material, the apparatus being configured to operate in an exposure mode in which the source material is irradiated by pulses and a nonexposure mode in which the source material is not irradiated, the apparatus comprising a radiation source configured to generate at least one off-droplet pulse during the nonexposure mode and to generate a plurality of on-droplet pulses during the exposure mode, and an energy controller configured to perform an energy measurement of the at least one off-droplet pulse during the nonexposure mode and to drive the pulse energy to a pulse energy setpoint based at least in part on the energy measurement of the at least one off-droplet pulse, the radiation source bring further configured to generate the on-droplet pulses having an energy at the pulse energy setpoint during the exposure mode. The pulses may be prepulses and the energy controller may be a prepulse energy controller. The prepulse energy controller may be configured to perform an energy measurement of a plurality of off-droplet prepulses. The apparatus may also include a dose controller configured to control a magnitude of a dose of energy delivered to the source material. The control loop of the dose controller is decoupled from a control loop of the prepulse energy controller.

According to another aspect of an embodiment, there is disclosed a method of controlling a device generating extreme ultraviolet radiation using source material, the device having an exposure period in which the source material is irradiated by pulses and a nonexposure period in which the source material is not irradiated, the method comprising generating off-droplet pulses during the nonexposure period, controlling a magnitude of energy of the off-droplet pulses to be at a pulse energy setpoint, and generating on-droplet pulses during the exposure period while controlling energy of the on-droplet pulses to be at the pulse energy setpoint. The pulses may be prepulses and the energy controller may be a prepulse energy controller. Generating on-droplet prepulses during the exposure period while controlling energy of the on-droplet prepulses may comprise performing open-loop control of prepulse energy of the on-droplet prepulses. Controlling a magnitude of energy comprises calibrating a prepulse energy controller based at least in part on the measured magnitude of energy of the at least one off-droplet prepulse. The method may further comprise controlling a magnitude of a dose of energy delivered to the source material.

According to another aspect of an embodiment, there is disclosed an apparatus for generating extreme ultraviolet radiation comprising a source of droplets of a source material, a laser source of pulsed laser radiation, the laser source being configured to operate in an exposure mode in which the droplets of source material are irradiated by laser pulses and a nonexposure mode in which the droplets of source material are not irradiated, the laser source being configured to generate at least one off-droplet pulse during the nonexposure mode and to generate a plurality of on-droplet pulses during the exposure mode, and an energy controller configured to perform an energy measurement of the at least one off-droplet pulse during the nonexposure mode and to drive the pulse energy to a pulse energy setpoint based at least in part on the energy measurement of the at least one off-droplet pulse, the radiation source bring further configured to generate the on-droplet pulses having an energy at the pulse energy setpoint during the exposure mode. The pulses may be prepulses and the energy controller may be a prepulse energy controller. The prepulse energy controller may be configured to perform an energy measurement of a plurality of off-droplet prepulses. The apparatus may also comprise a dose controller configured to control a magnitude of a dose of energy delivered to the source material. A control loop of the dose controller is decoupled from a control loop of the prepulse energy controller.

According to another aspect of an embodiment, there is disclosed a method of generating extreme ultraviolet radiation using source material, the method comprising generating droplets of source material, generating off-droplet laser pulses which do not strike any droplets of source material, controlling a magnitude of energy of the off-droplet laser pulses to be at a pulse energy setpoint, and generating on-droplet pulses which strike droplets of source material while controlling energy of the on-droplet pulses to be at the pulse energy setpoint. The pulses may be prepulses and the energy controller may be a prepulse energy controller. Generating on-droplet prepulses may comprise performing open-loop control of prepulse energy of the on-droplet prepulses. Controlling a magnitude of energy may comprise calibrating a prepulse energy controller based at least in part on the measured magnitude of energy of the at least one off-droplet prepulse. The method may further comprise controlling a magnitude of a dose of energy delivered to the source material.

Further embodiments, features, and advantages of the subject matter of the present disclosure, as well as the structure and operation of the various embodiments are described in detail below with reference to accompanying drawings.

BRIEF DESCRIPTION OF THE DRAWINGS

The accompanying drawings, which are incorporated herein and form part of the specification, illustrate concepts set forth in the present disclosure, and, together with the verbal description, further serve to explain the principles of the present invention and to enable a person skilled in the relevant art(s) to make and use the present invention.

Figure 1:
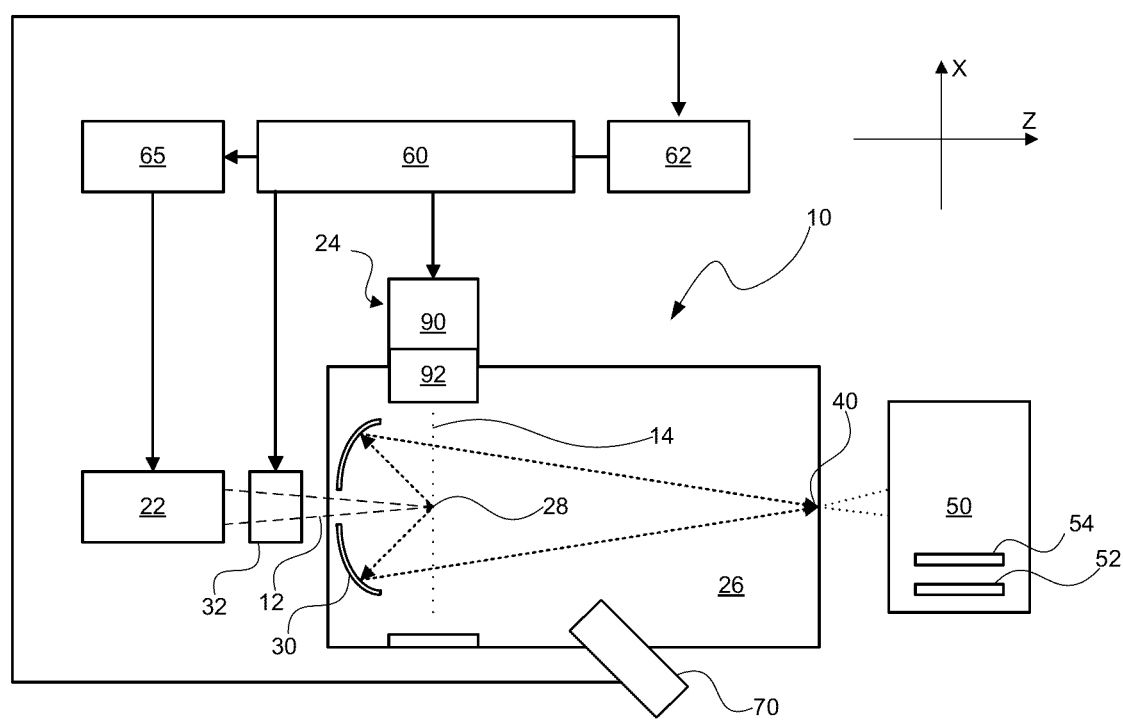
FIG. 1 is a schematic, not-to-scale view of an overall broad conception for a laser-produced plasma EUV radiation source system according to an aspect of an embodiment.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below.

With initial reference to FIG. 1 there is shown a schematic view of an exemplary EUV radiation source, e.g., a laser produced plasma EUV radiation source 10 according to one aspect of an embodiment of the present invention. As shown, the EUV radiation source 10 may include a pulsed or continuous laser source 22, which may for example be a pulsed gas discharge $CO_2$ laser source producing a beam 12 of radiation at a wavelength generally below 20 for example, in the range of about 10.6 μm to about 0.5 μm or less. The pulsed gas discharge $CO_2$ laser source may have DC or RF excitation operating at high power and at a high pulse repetition rate.

The EUV radiation source 10 also includes a source material delivery system 24 for delivering source material in the form of liquid droplets or a continuous liquid stream. In this example, the source material is a liquid, but it could also be a solid or gas. The source material may be made up of tin or a tin compound, although other materials could be used. In the system depicted the source material delivery system 24 introduces droplets 14 of the source material into the interior of a vacuum chamber 26 to an irradiation region 28 where the source material may be irradiated to produce plasma. It should be noted that as used herein an irradiation region is a region where source material irradiation may occur, and is an irradiation region even at times when no irradiation is actually occurring. The EUV light source may also include a beam focusing and steering system 32 as will be explained in more detail below in conjunction with FIG. 2.

In the system shown, the direction from the laser source 22 towards the irradiation region 28, that is, the nominal direction of propagation of the beam 12, may be taken as the Z axis. The path the droplets 14 take from the source material delivery system 24 to the irradiation region 28 may be taken as the −X axis. The view of FIG. 1 is thus normal to the XZ plane. Also, the system may be configured so that the droplets 14 travel as depicted, it will be understood by one having ordinary skill in the art the other arrangements can be used in which the droplets travel horizontally or at some angle with respect to gravity between and including 90 degrees (horizontal) and 0 degrees (vertical).

The EUV radiation source 10 may also include an EUV light source controller system 60, which may also include a laser firing control system 65, along with the beam steering system 32. The EUV radiation source 10 may also include a detector such as a droplet position detection system which may include one or more droplet imagers 70 that generate an output indicative of the absolute or relative position of a droplet, e.g., relative to the irradiation region 28, and provide this output to a position detection feedback system 62.

The droplet position detection feedback system 62 may use the output of the droplet imager 70 to compute a droplet position and trajectory, from which a droplet position error can be computed. The droplet position error can be computed on a droplet-by-droplet basis, or on average, or on some other basis. The droplet position error may then be provided as an input to the light source controller 60. In response, the light source controller 60 can generate a control signal such as a laser position, direction, or timing correction signal and provide this control signal to the laser beam steering system 32. The laser beam steering system 32 can use the control signal to change the location and/or focal power of the laser beam focal spot within the chamber 26. The laser beam steering system 32 can also use the control signal to change the geometry of the interaction of the beam 12 and the droplet 14. For example, the beam 12 can be made to strike the droplet 14 off-center or at an angle of incidence other than directly head-on.

As shown in FIG. 1, the source material delivery system 24 may include a source material delivery control system 90. The source material delivery control system 90 is operable in response to a signal, for example, the droplet position error described above, or some quantity derived from the droplet position error provided by the system controller 60, to adjust paths of the source material through the irradiation region 28. This may be accomplished, for example, by repositioning the point at which a source material delivery mechanism 92 releases the droplets 14. The droplet release point may be repositioned, for example, by tilting the source delivery mechanism 92 or by shifting the source delivery mechanism 92. The source material delivery mechanism 92 extends into the chamber 26 and is preferably externally supplied with source material and connected to a gas source to place the source material in the source material delivery mechanism 92 under pressure.

Continuing with FIG. 1, the radiation source 10 may also include one or more optical elements. In the following discussion, a collector 30 is used as an example of such an optical element, but the discussion applies to other optical elements as well. The collector 30 may be a normal incidence reflector, for example, implemented as a Mo/Si multi-layered mirror (MLM). The collector 30 may be in the form of a prolate ellipsoid, with a central aperture to allow the laser radiation 12 to pass through and reach the irradiation region 28. The collector 30 may be, e.g., in the shape of a ellipsoid that has a first focus at the irradiation region 28 and a second focus at a so-called intermediate point 40 (also called the intermediate focus 40) where the EUV radiation may be output from the EUV radiation source 10 and input to, e.g., an integrated circuit lithography scanner or stepper 50 which uses the radiation, for example, to process a silicon wafer work piece 52 in a known manner using a reticle or mask 54. The mask 54 may be transmissive or reflective. For EUV applications the mask 54 is generally reflective. The silicon wafer work piece 52 is then additionally processed in a known manner to obtain an integrated circuit device.

Figure 2:
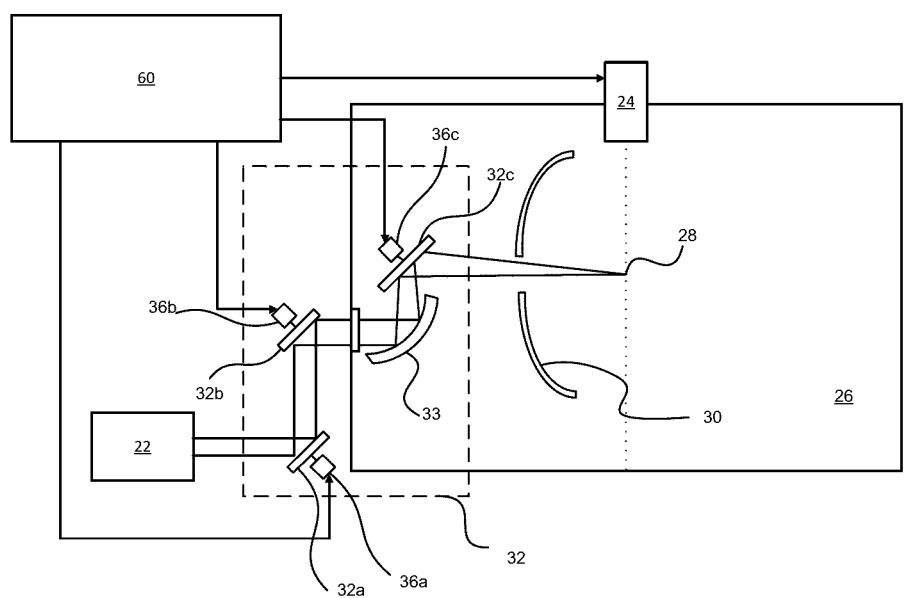
FIG. 2 is a schematic, not-to-scale view of a portion of the system of FIG. 1 according to an aspect of an embodiment.

Continuing to FIG. 2, it can be seen that the beam steering system 32 may include one or more steering mirrors 32a, 32b, and 32c. Although three mirrors are shown, it is to be appreciated that more than three or as few as one steering mirror may be employed to steer the beam. Moreover, although mirrors are shown, it is to be appreciated that other optics such as prisms may be used and that one or more of the steering optics may be positioned inside the chamber 26. See for example U.S. Pat. No. 7,598,509 issued Oct. 6, 2009, and titled "Laser Produced Plasma EUV Light Source," the entire contents of which are hereby incorporated by reference herein. For the embodiment shown, each of the steering mirrors 32a, 32b, and 32c may be mounted on a respective tip-tilt actuator 36a, 36b, and 36c which may move each of the steering mirrors 32a, 32b, and 32c independently in either or both of two dimensions. Mirror 33 turns and focuses the beam.

Figure 3:
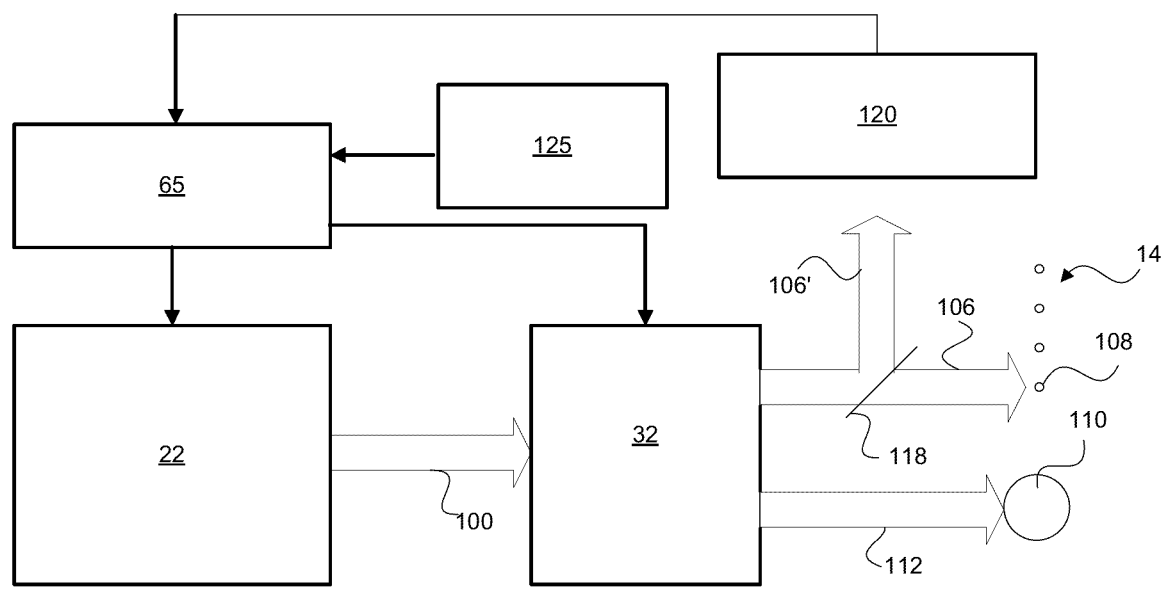
FIG. 3 is a not-to-scale schematic diagram of a drive pulse system according to one aspect of an embodiment.

FIG. 3 is a not-to-scale schematic diagram of a drive pulse system according to one aspect of an embodiment. The drive pulse system is arranged to be able to supply pulses to the droplets of source material 14. The drive pulse system includes, among other features, the radiation source 22 capable of producing a pulse 100. The beam steering system 32 relays the pulse 100 to the chamber 26 as pulse 106 where it strikes a droplet 14 of source material.

In the example shown, the source material 14 is originally in the form of a droplet 108 in a stream of droplets released by the source delivery mechanism 92 (FIG. 1). If the source material has already been subjected to one or more pulses then it may no longer be in a droplet form. For the sake of clarity, the source material before it is subjected to any pulse is referred to herein as a droplet and source material after it has been subjected to any pulse is referred to herein as a target. According to an aspect of an embodiment the pulse 106 is a first pulse that preconditions the source material by, for example, changing the geometric distribution of the source material, for example, from the droplet 108 to conditioned target form 110 such as a disk, cloud, etc. This conditioned target form 110 is then struck by a second pulse 112 that further conditions the source material for phase conversion by a later pulse.

Also, the term "prepulse" is sometimes used to describe a pulse having the primary purpose of conditioning the target material and the term "main pulse" is sometimes used to describe the final pulse having the primary purpose of creating a plasma from the source material. It is possible, however, in some applications that the purposes of the pulses will not be so separate and distinct.

The two pulses may be produced by separate lasers or they may be produced by a single laser. For example, in the system of FIG. 3 may include a beam splitter 118 to split off part of the energy of the beam 106 into beam 106' so the energy of the beam 106 may be measured by a prepulse energy control system 120 which uses the measurement to optimize prepulse energy. Also shown in FIG. 3 is RF control module 125 which controls dose.

In the system shown, the energy of the pulse 106 is typically measured "on-droplet", that is, during exposure when the pulses strike droplets, and the measurement is used as part of a closed-loop control system controlling prepulse energy. The energy is measured by prepulse energy control system 120 which supplies a signal indicative of the measured energy to the controller 65. The controller 65 in turn uses the measured energy to control the energy of the pulses. When the controller is used in this fashion to control prepulse energy during an exposure, dose stability, that is, the pulse-to-pulse stability of the energy supplied to the droplet, exhibits a tendency to worsen. Thermal (cold-to-hot) transients at start up reduce the range of adjustability (overhead) of the dose of energy supplied to the droplet by the pulse. There are also low-frequency disturbances to dose stability. These effects may at least partially be due to an interaction between the prepulse energy control system 120 and the dose controller, RF control module 125, that uses the drive laser energy to actuate two mechanisms for pulse energy control, namely (1) the peak and integrated energy of the main pulse and (2) target size (controlled by controlling PP energy). This type of PP energy control, i.e, using on-droplet PP energy measurements, reduces the available range of target sizes available for dose control.

Thus, optimization of the prepulse energy using on-droplet pulse energy measurements interacts undesirably with other controls, particularly the dose control effected by the RF control module. If, however, off-droplet measurements of prepulse energy are used for prepulse energy optimization, then these undesirable interactions are avoided. Thus optimization of prepulse energy occurs during off-droplet pulses. The prepulse energy can then be controlled open-loop during on-droplet periods. This effectively decouples the EUV dose control loop from the PP energy control loop.

Figure 4:
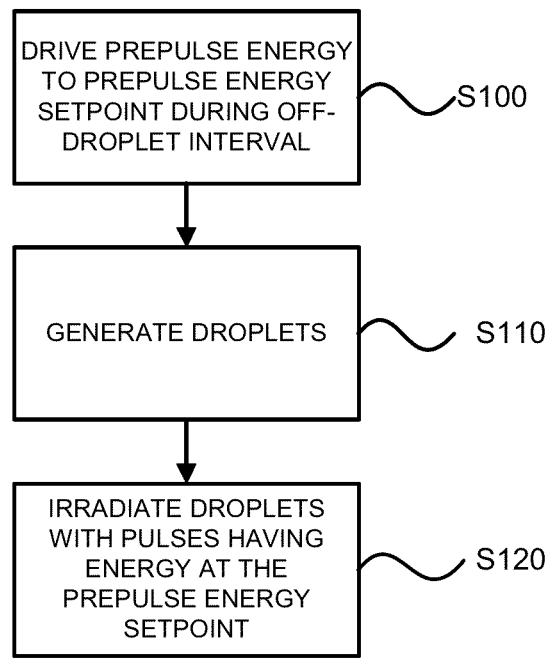
FIG. 4 is a flowchart showing a mode of operation of a pulse delivery system according to one aspect of an embodiment.

FIG. 4 is a flowchart showing a method of controlling prepulse energy based on measurements made during a nonexposure interval, that is, an off-droplet interval when the prepulses are not being used to irradiate any droplets. In step S100, which occurs during an off-droplet (nonexposure) interval, the prepulse energy measured and controlled (driven) using a closed loop control method to a prepulse energy setpoint. In a step S110, droplets are generated. During step S120, the pulses having an energy at the prepulse energy setpoint are used to irradiate the droplets.

The present disclosure is made with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed. For example, the control module functions can be divided among several systems or performed at least in part by an overall control system.

The above description includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

Other aspects of the invention are set out in the following numbered clauses.

1. Apparatus for generating extreme ultraviolet radiation using source material, the apparatus being configured to operate in an exposure mode in which the source material is irradiated by pulses and a nonexposure mode in which the source material is not irradiated, the apparatus comprising: a radiation source configured to generate at least one off-droplet pulse during the nonexposure mode and to generate a plurality of on-droplet pulses during the exposure mode; and an energy controller configured to perform an energy measurement of the at least one off-droplet pulse during the nonexposure mode and to drive the pulse energy to a pulse energy setpoint based at least in part on the energy measurement of the at least one off-droplet pulse, the radiation source bring further configured to generate the on-droplet pulses having an energy at the pulse energy setpoint during the exposure mode.

2. Apparatus as in clause 1 wherein the pulses are prepulses and the energy controller is a prepulse energy controller.

3. Apparatus as in clause 2 wherein the prepulse energy controller is configured to perform an energy measurement of a plurality of off-droplet prepulses.

4. Apparatus as in clause 1, 2, or 3 further comprising a dose controller configured to control a magnitude of a dose of energy delivered to the source material.

5. Apparatus as in clause 3 wherein a control loop of the dose controller is decoupled from a control loop of the prepulse energy controller.

6. A method of controlling a device generating extreme ultraviolet radiation using source material, the device having an exposure period in which the source material is irradiated by pulses and a nonexposure period in which the source material is not irradiated, the method comprising:

generating off-droplet pulses during the nonexposure period;
controlling a magnitude of energy of the off-droplet pulses to be at a pulse energy setpoint; and
generating on-droplet pulses during the exposure period while controlling energy of the on-droplet pulses to be at the pulse energy setpoint.

7. A method as in clause 6 wherein the pulses are prepulses and the energy controller is a prepulse energy controller.

8. A method as in clause 7 wherein the generating on-droplet prepulses during the exposure period while controlling energy of the on-droplet prepulses comprises performing open-loop control of prepulse energy of the on-droplet prepulses.

9. A method as in clause 7 further comprising measuring a magnitude of energy of the at least one off-droplet prepulse and wherein controlling a magnitude of energy comprises calibrating a prepulse energy controller based at least in part on the measured magnitude of energy of the at least one off-droplet prepulse.

10. A method as in clause 9 further comprising controlling a magnitude of a dose of energy delivered to the source material.

11. Apparatus for generating extreme ultraviolet radiation comprising:
a source of droplets of a source material;
a laser source of pulsed laser radiation, the laser source being configured to operate in an exposure mode in which the droplets of source material are irradiated by laser pulses and a nonexposure mode in which the droplets of source material are not irradiated, the laser source being configured to generate at least one off-droplet pulse during the nonexposure mode and to generate a plurality of on-droplet pulses during the exposure mode; and an energy controller configured to perform an energy measurement of the at least one off-droplet pulse during the nonexposure mode and to drive the pulse energy to a pulse energy setpoint based at least in part on the energy measurement of the at least one off-droplet pulse, the radiation source bring further configured to generate the on-droplet pulses having an energy at the pulse energy setpoint during the exposure mode.

12. Apparatus as in clause 11 wherein the pulses are prepulses and the energy controller is a prepulse energy controller.

13. Apparatus as in clause 12 wherein the prepulse energy controller is configured to perform an energy measurement of a plurality of off-droplet prepulses.

14. Apparatus as in clause 11, 12, or 13 further comprising a dose controller configured to control a magnitude of a dose of energy delivered to the source material.

15. Apparatus as in clause 13 wherein a control loop of the dose controller is decoupled from a control loop of the prepulse energy controller.

16. A method of generating extreme ultraviolet radiation using source material, the method comprising:
generating droplets of source material;
generating off-droplet laser pulses which do not strike any droplets of source material;
controlling a magnitude of energy of the off-droplet laser pulses to be at a pulse energy setpoint; and
generating on-droplet pulses which strike droplets of source material while controlling energy of the on-droplet pulses to be at the pulse energy setpoint.

17. A method as in clause 16 wherein the pulses are prepulses and the energy controller is a prepulse energy controller.

18. A method as in clause 17 wherein the generating on-droplet prepulses comprises performing open-loop control of prepulse energy of the on-droplet prepulses.

19. A method as in clause 17 further comprising measuring a magnitude of energy of the at least one off-droplet prepulse and wherein controlling a magnitude of energy comprises calibrating a prepulse energy controller based at least in part on the measured magnitude of energy of the at least one off-droplet prepulse.

20. A method as in clause 19 further comprising controlling a magnitude of a dose of energy delivered to the source material.

What is claimed is:

1. Apparatus for generating extreme ultraviolet radiation using source material, the apparatus being configured to operate in an exposure mode in which the source material is irradiated by pulses and a nonexposure mode in which the source material is not irradiated, the apparatus comprising:
a radiation source configured to generate at least one off-droplet pulse during the nonexposure mode and to generate a plurality of on-droplet pulses during the exposure mode; and
an energy controller configured to perform an energy measurement of the at least one off-droplet pulse during the nonexposure mode and to drive pulse energy to a pulse energy setpoint based at least in part on the energy measurement of the at least one off-droplet pulse, the radiation source bring further configured to generate the on-droplet pulses having an energy at the pulse energy setpoint during the exposure mode.

2. Apparatus as claimed in claim 1 wherein the pulses are prepulses and the energy controller is a prepulse energy controller.

3. Apparatus as claimed in claim 2 wherein the prepulse energy controller is configured to perform an energy measurement of a plurality of off-droplet prepulses.

4. Apparatus as claimed in claim 1 further comprising a dose controller configured to control a magnitude of a dose of energy delivered to the source material.

5. Apparatus as claimed in claim 4 wherein a control loop of the dose controller is decoupled from a control loop of the prepulse energy controller.

6. A method of controlling a device generating extreme ultraviolet radiation using source material, the device having an exposure period in which the source material is irradiated by pulses and a nonexposure period in which the source material is not irradiated, the method comprising:
generating off-droplet pulses during the nonexposure period;
controlling a magnitude of energy of the off-droplet pulses to be at a pulse energy setpoint; and
generating on-droplet pulses during the exposure period while controlling energy of the on-droplet pulses to be at the pulse energy setpoint.

7. A method as claimed in claim 6 wherein the pulses are prepulses and the energy controller is a prepulse energy controller.

8. A method as claimed in claim 7 wherein the generating on-droplet prepulses during the exposure period while controlling energy of the on-droplet prepulses comprises performing open-loop control of prepulse energy of the on-droplet prepulses.

9. A method as claimed in claim 7 further comprising measuring a magnitude of energy of the at least one off-droplet prepulse and wherein controlling a magnitude of energy comprises calibrating a prepulse energy controller based at least in part on the measured magnitude of energy of the at least one off-droplet prepulse.

10. A method as claimed in claim 9 further comprising controlling a magnitude of a dose of energy delivered to the source material.

11. Apparatus for generating extreme ultraviolet radiation comprising:
a source of droplets of a source material;
a laser source of pulsed laser radiation, the laser source being configured to operate in an exposure mode in which the droplets of source material are irradiated by laser pulses and a nonexposure mode in which the droplets of source material are not irradiated, the laser source being configured to generate at least one off-droplet pulse during the nonexposure mode and to generate a plurality of on-droplet pulses during the exposure mode; and
an energy controller configured to perform an energy measurement of the at least one off-droplet pulse during the nonexposure mode and to drive pulse energy to a pulse energy setpoint based at least in part on the energy measurement of the at least one off-droplet pulse, the radiation source bring further configured to generate the on-droplet pulses having an energy at the pulse energy setpoint during the exposure mode.

12. Apparatus as claimed in claim 11 wherein the pulses are prepulses and the energy controller is a prepulse energy controller.

13. Apparatus as claimed in claim 12 wherein the prepulse energy controller is configured to perform an energy measurement of a plurality of off-droplet prepulses.

14. Apparatus as claimed in claim 11 further comprising a dose controller configured to control a magnitude of a dose of energy delivered to the source material.

15. Apparatus as claimed in claim 14 wherein a control loop of the dose controller is decoupled from a control loop of the prepulse energy controller.

16. A method of generating extreme ultraviolet radiation using source material, the method comprising:
   generating droplets of source material;
   generating off-droplet laser pulses which do not strike any droplets of source material;
   controlling an energy of the off-droplet laser pulses to be at a pulse energy setpoint; and
   generating on-droplet pulses which strike droplets of source material while controlling an energy of the on-droplet pulses to be at the pulse energy setpoint.

17. A method as claimed in claim 16 wherein the on-droplet pulses are on-droplet prepulses and controlling an energy of the on-droplet laser pulses comprises controlling the energy of the on-droplet prepulses.

18. A method as claimed in claim 17 wherein the generating on-droplet prepulses comprises performing open-loop control of prepulse energy of the on-droplet prepulses.

19. A method as claimed in claim 17 further comprising measuring a magnitude of energy of the at least one off-droplet prepulse and wherein controlling a magnitude of energy comprises calibrating a prepulse energy controller based at least in part on the measured magnitude of energy of the at least one off-droplet prepulse.

20. A method as claimed in claim 19 further comprising controlling a magnitude of a dose of energy delivered to the source material.

\* \* \* \* \*